United States Patent
Mouleyre

(10) Patent No.: US 9,706,020 B2
(45) Date of Patent: Jul. 11, 2017

(54) TEXTILE SURFACE AND TEXTILE MATERIAL FOR ABSORBING ELECTROMAGNETIC WAVES, AND PROTECTIVE DEVICE COMPRISING A TEXTILE SURFACE OR TEXTILE MATERIAL

(75) Inventor: Christian Mouleyre, Saint Cyr Au Mont d Or (FR)

(73) Assignee: CALICEA, Paris (FR)

( * ) Notice: Subject to any disclaimer, the term of this patent is extended or adjusted under 35 U.S.C. 154(b) by 622 days.

(21) Appl. No.: 13/990,310

(22) PCT Filed: Nov. 29, 2011

(86) PCT No.: PCT/FR2011/052811
§ 371 (c)(1),
(2), (4) Date: Jul. 30, 2013

(87) PCT Pub. No.: WO2012/072945
PCT Pub. Date: Jun. 7, 2012

(65) Prior Publication Data
US 2013/0303242 A1    Nov. 14, 2013

(30) Foreign Application Priority Data
Nov. 30, 2010 (FR) .................. 10 59916

(51) Int. Cl.
*H04B 1/08* (2006.01)
*H04M 1/00* (2006.01)
(Continued)

(52) U.S. Cl.
CPC ......... *H04M 1/0202* (2013.01); *H01Q 1/245* (2013.01); *H01Q 1/526* (2013.01);
(Continued)

(58) Field of Classification Search
CPC ....... B32B 27/08; B32B 5/26; B29K 2309/08; C08J 5/18; C08J 2367/02; D03D 15/00;
(Continued)

(56) References Cited

U.S. PATENT DOCUMENTS 6,277,771 B1 * 8/2001 Nishimura ............ B29C 70/22
324/71.1
6,855,883 B1 * 2/2005 Matsui ................. H05K 9/009
174/393
(Continued)

FOREIGN PATENT DOCUMENTS

DE    102006007518 A1    8/2007
EP     1148774 A1        10/2001
(Continued)

OTHER PUBLICATIONS

International Search Report issued Feb. 1, 2012 re: PCT/FR2011/052811; citing: WO 2010/033093 A1, U.S. Pat. No. 6,855,883 B1, EP 1 148 774 A1, US 2007/159753 A1 and DE 10 2006 007518 A1.

*Primary Examiner* — Yuwen Pan
*Assistant Examiner* — Paul P Tran
(74) *Attorney, Agent, or Firm* — Cantor Colburn LLP

(57) ABSTRACT

The invention relates to a textile surface for at least partially absorbing electromagnetic waves. The textile surface comprises textile elements, such as threads or fibers, of at least first and second types. The textile elements of the first and second types have electrical-conduction properties. Each textile element of the first type comprises a synthetic-material core coated with a first metal. The textile elements of the second type are made of a second metal. The invention also relates to a textile material comprising at least two textile surfaces, and to a protective device comprising a textile surface or a textile material.

19 Claims, 4 Drawing Sheets

(51) Int. Cl.

| | | |
|---|---|---|
| *H01B 7/29* | (2006.01) | |
| *H01B 11/06* | (2006.01) | |
| *H05K 9/00* | (2006.01) | |
| *H01Q 17/00* | (2006.01) | |
| *B29D 22/00* | (2006.01) | |
| *B29D 23/00* | (2006.01) | |
| *B32B 1/08* | (2006.01) | |
| *B60R 21/16* | (2006.01) | |
| *B32B 3/06* | (2006.01) | |
| *B32B 9/00* | (2006.01) | |
| *B32B 27/32* | (2006.01) | |
| *D03D 15/00* | (2006.01) | |
| *B32B 15/14* | (2006.01) | |
| *B32B 5/26* | (2006.01) | |
| *H04M 1/02* | (2006.01) | |
| *H01Q 1/24* | (2006.01) | |
| *H01Q 1/52* | (2006.01) | |

(52) U.S. Cl.
CPC .... *H05K 9/009* (2013.01); *Y10T 428/249921* (2015.04); *Y10T 442/339* (2015.04)

(58) Field of Classification Search
CPC ...... D21F 7/083; H01Q 17/00; H01Q 17/001; H01Q 17/004; H01Q 17/008; H01Q 1/245; H01Q 1/526; H04B 1/3888; H04M 1/0202; H04M 1/0283; H05K 9/009; F41H 3/00; F41H 3/02; F41H 5/0442; F41H 5/0464; G01R 29/105; A41D 31/0061
USPC ................ 342/1, 2, 3, 4; 428/221; 442/189; 455/575.1–575.8
See application file for complete search history.

(56) References Cited

U.S. PATENT DOCUMENTS

| | | | |
|---|---|---|---|
| 2001/0019928 A1* | 9/2001 | Takagi .................. | D02G 3/441 442/232 |
| 2002/0104576 A1* | 8/2002 | Howland ......... | A41D 19/01505 139/421 |
| 2007/0159753 A1* | 7/2007 | Randall .................. | H05K 9/009 361/111 |
| 2010/0273049 A1* | 10/2010 | Vidal .................. | H01M 4/0492 429/207 |

FOREIGN PATENT DOCUMENTS

| | | | | |
|---|---|---|---|---|
| GB | 2442298 A | * | 4/2008 | ......... A41D 31/0072 |
| TR | WO 2010033093 A1 | * | 3/2010 | .............. D04B 1/16 |
| WO | 2010033093 A1 | | 3/2010 | |

* cited by examiner

TEXTILE SURFACE AND TEXTILE MATERIAL FOR ABSORBING ELECTROMAGNETIC WAVES, AND PROTECTIVE DEVICE COMPRISING A TEXTILE SURFACE OR TEXTILE MATERIAL

TECHNICAL FIELD

The present invention relates to a textile surface and a textile material for at least partially absorbing electromagnetic waves, as well as a protective device against electromagnetic waves including a protection area having a textile surface or a textile material.

BACKGROUND

With the rapid growth of wireless communication means, such as mobile telephones or wireless Internet connections, there is growing concern about electromagnetic waves and the related health risks.

In fact, the electromagnetic waves emitted for wireless communication, and more particularly for mobile telephones, are in the microwave frequency range. This frequency range is in particular known for its interaction with the water molecule, which makes up 70% of the human body. It is therefore possible, as certain scientific studies have tended to indicate, that these waves may have a direct influence on health.

To protect against these risks, it is known to use textile surfaces, like those described in document U.S. Pat. No. 6,855,883, making it possible to absorb part of the electromagnetic waves and therefore, when they equip a protective device, to limit exposure to such waves.

Such textile surfaces are generally obtained by weaving metal conductive threads together. The absorption properties of these surfaces are directly related to the conductivity of the metal making up the threads and the density of the weave. As a result, a textile surface with good absorption properties of the electromagnetic waves requires the use of a metal with a high conductivity, such as gold, silver or copper, with a high weave density.

Such textile surfaces are relatively expensive, which limits their wide-scale use.

BRIEF SUMMARY

The invention aims to resolve this drawback.

One aim of the invention is therefore to provide a textile surface having electromagnetic wave absorption qualities similar to those of a textile surface made entirely from a metal with a low conductivity while having a much lower production cost.

To that end, the invention relates to a textile surface for at least partially absorbing electromagnetic waves, including textile elements, such as threads or fibers, of at least first and second types, the textile elements of the first and second types having electrical conduction properties, each textile element of the first type including a synthetic-material core covered with a first metal, the textile elements of the second type being made from a second metal.

Such a textile surface makes it possible, by using textile elements of a first type having a synthetic-material core covered with a metal with high conductivity, with textile elements of a second type made from a less expensive metal, to obtain an absorption quality similar to that of a textile surface made entirely from textile elements with a high-conductivity metal while having much lower production costs. In fact, the high-conductivity metal being able to be used as a coating on a synthetic-material core, it does not significantly increase the cost of the textile surface, while offering, due to its cooperation with the metal making up the textile elements of the second type, good electromagnetic wave absorption quality.

Advantageously, the first metal is silver.

Silver is a noble metal having high conductivity that therefore allows the textile surface to have a good electromagnetic wave absorption quality.

Preferably, the core of the textile elements of the first type is made from a polymer of the polyamide type.

Such material makes it possible to provide a core for the textile elements of the first type that is robust and inexpensive.

Preferably, the second metal is steel or a steel alloy.

The steel makes it possible to provide textile elements of the second type that have both good conductivity and a lower cost.

Advantageously, the textile surface also includes textile elements of a third type, made from electrically insulating material, such as polyester.

Such a third type of textile elements makes it possible to facilitate production of the textile surface, these textile elements making it possible, when they are combined with metallic textile elements, to provide threads having the necessary flexibility for weaving or knitting.

Advantageously, the textile surface includes covered strands or threads respectively obtained by twisting or covering at least one textile elements of the third type with at least one textile element of the first type or the second type.

The formation of covered strands or threads from textile elements of the third type with elements of the first or second types makes it possible to provide threads or fibers having the necessary flexibility for weaving or knitting.

Advantageously, the textile surface is obtained by weaving.

Weaving makes it possible to obtain a textile surface having, for a given thickness, a maximum density of conductive textile elements.

Preferably, the textile surface has weft threads including textile elements of the first or second type, the textile surface having warp threads including textile elements of a different type, from among the textile elements of the first and second types.

Advantageously, the textile surface is formed from polyamide threads covered with silver for the weft or warp threads and stainless steel/polyester threads for the warp or weft threads, respectively.

The invention also relates to a textile material for at least partially absorbing electromagnetic waves including at least two layers each made up of a textile surface according to the invention.

Such a textile material makes it possible to obtain high-quality absorption of electrostatic waves, since it combines the absorption of at least two layers of textile surfaces.

The invention also relates to a protective device against electromagnetic waves designed to house a mobile telephone, the device including:
  a housing designed to receive the mobile telephone, and
  at least one protective area designed to be inserted between the head of a user and the mobile telephone, the protective area including a textile surface according to the invention or a textile material according to the invention.

Such a device allows the user to protect himself from the electromagnetic waves emitted by the mobile telephone during a telephone call.

Advantageously, the device includes a flap which, including the protective area, can be moved between an open position, in which the flap is designed to be positioned retracted from the mobile telephone received in the housing, and a closed position, in which the flap is designed to be positioned near the mobile telephone.

More specifically, when the flap in the closed position is positioned against the front face of the mobile telephone. Such a flap makes it possible to provide access to the mobile telephone during handling thereof offering good protection against the electromagnetic waves emitted by the mobile telephone during a telephone call.

In one preferred embodiment, the flap is made by stacking at least:
- a first layer forming said protective area, made in a textile surface or textile material as presented above; and
- a second layer forming an outer facing, the second layer comprising at least one first orifice arranged such that when the flap is in the closed position, each first orifice is positioned centered across from a microphone of the mobile telephone.

Such an arrangement is advantageous insofar as it makes it possible to provide an aesthetic device in which the attenuation of the acoustic waves picked up by the microphones of the mobile telephone is minimized, when the flap is in the closed position.

Preferably, the second layer forming the outer facing comprises at least one second orifice arranged such that when the flap is in the closed position, each second orifice is positioned centered across from a speaker of the mobile telephone.

Such an arrangement is advantageous in that it makes it possible to provide an aesthetic device in which the attenuation of the acoustic waves generated by the speaker of the mobile telephone is minimized, when the flap is in the closed position.

For example, the second layer is made from leather or plastic.

According to one feature, the stack also comprises a third layer forming an inner facing, this third layer comprising at least one first orifice, and preferably at least one second orifice, arranged such that when the flap is in the closed position, each first orifice is positioned centered across from a microphone of the mobile telephone, and each second orifice is positioned centered across from a speaker of the mobile telephone.

For example, the third layer is made from suede cloth.

According to another feature, the stack also comprises a fourth, reinforcing layer, positioned between the second and third layers, this fourth layer comprising at least one first orifice, and preferably at least one second orifice, arranged such that when the flap is in the closed position, each first orifice is positioned centered across from a microphone of the mobile telephone, and each second orifice is positioned centered across from the speaker of the mobile telephone.

For example, the fourth layer is made from Plexiglas.

According to another feature, the stack comprises a fifth layer made from cardboard, this fifth layer comprising at least one first orifice, and preferably at least one second orifice, arranged such that when the flap is in the closed position, each first orifice is positioned centered across from a microphone of the mobile telephone, and each second orifice is positioned centered across from a speaker of the mobile telephone.

Advantageously, the housing is provided with at least one first orifice arranged to be positioned centered across from a microphone of the mobile telephone, and preferably at least one second orifice arranged to be positioned centered across from a speaker of the mobile telephone, when said mobile telephone is received in the housing.

Such an arrangement is advantageous insofar as it makes it possible to provide a housing perfectly gripping the mobile telephone, without attenuating the acoustic waves generated by the speaker of the mobile telephone or the acoustic waves picked up by the microphones, when the flap is in the closed position.

The invention lastly relates to an assembly characterized in that it comprises a mobile telephone and a device as presented above.

BRIEF DESCRIPTION OF THE DRAWINGS

In any case, the invention will be well understood using the following description provided in reference to the appended diagrammatic drawing, showing, as non-limiting examples, three embodiments of this textile surface and this textile material as well as two embodiments of this protective device against electromagnetic waves.

For the different embodiments, the same references will be used for identical elements or elements performing the same function, so as to simplify the description.

DETAILED DESCRIPTION

Figure 1:
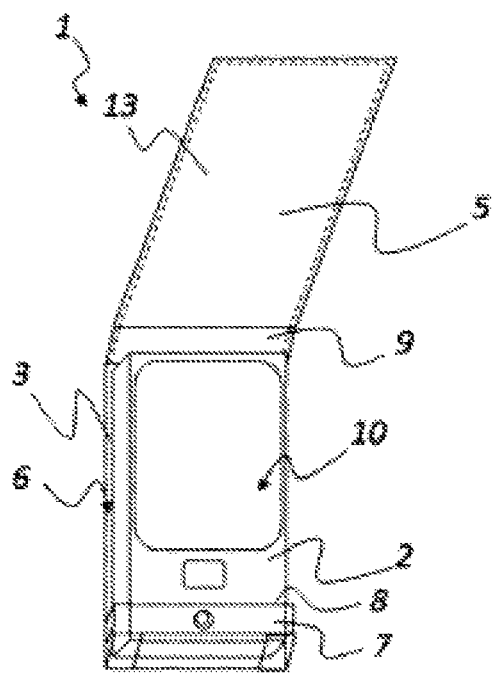
FIG. 1 is a diagrammatic perspective view of a first embodiment of a protective device against electromagnetic waves for a mobile telephone.

FIG. 1 illustrates a first embodiment of a protective device 1 against electromagnetic waves assuming the form of a case housing a mobile telephone 2.

The protective device 1 has a first part 3 serving to house the mobile telephone 2 and a second part assuming the form of a flap 5 or cover.

The first part 3 comprises a support surface 6, with dimensions similar to those of the surface of the mobile telephone 2 to be housed, having means for maintaining the telephone on the support surface 6. In FIG. 1, the maintaining means assume the form of a cradle 7 gripping the lower portion 8 of the mobile telephone 2, but these means may assume other forms, such as elastic bands present on the lower and upper portion of the support surface 6.

The support surface 6 and the maintaining means are made from a material that is transparent to the electromagnetic waves in the frequency range that is used in the mobile telephone.

The flap 5 of the protective device 1 is attached on the first part 3 using a strip 9 of a material similar to the support surface 6. In this way, the flap 5 can be moved between an open position, in which it provides access to the controls of the mobile telephone 2, and a closed position, in which it covers the front face 10 of the mobile telephone 2, such that it is inserted between the head of a user and the mobile telephone 2 during a telephone call.

The flap 5 has dimensions similar to those of the surface of the mobile telephone 2.

Figure 2:
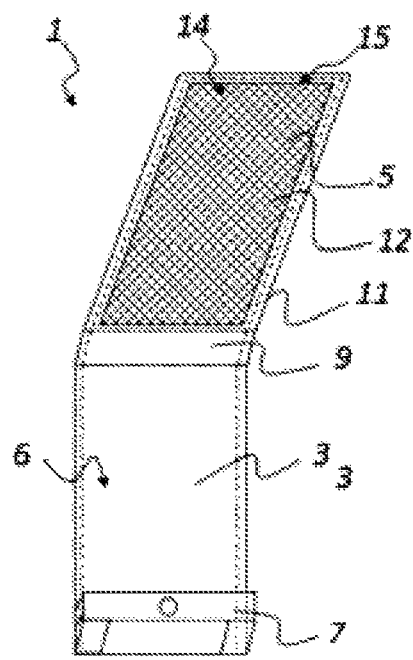
FIG. 2 is a diagrammatic perspective view with no mobile telephone, the trim of the part comprising the textile surface having been removed.
Figure 3:
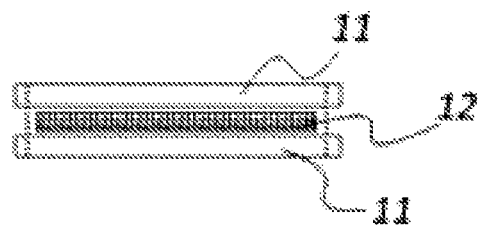
FIG. 3 is a transverse cross-sectional view of the flap.

The flap 5, as illustrated in FIGS. 2 and 3, includes a textile layer encapsulated between two trim surfaces 11, such as leather, textile or synthetic material surfaces. Out of a concern for aesthetic cohesion, the trim surfaces 11 may be of the same type as the support surface 6.

The textile layer may be a textile surface (not shown), or a textile material 12 including at least two textile surfaces, suitable for adsorbing electromagnetic waves. The textile layer forms a protective area 13 against the electromagnetic waves.

According to a first embodiment of the textile surface, the textile surface is a fabric including weft threads 14 and warp threads 15.

The warp threads 15 are formed by a core (not shown), made from a polymer of the polyamide type, and covered with silver.

The weft threads 14 are made of strands (not shown) made by twisting a steel thread (not shown) with a polyester thread (not shown).

According to this embodiment, with a composition of 54% silver-covered polyamide threads, 23% stainless steel threads and 23% polyester threads, a textile material 11 including two juxtaposed textile surfaces has electromagnetic wave attenuations measured using the GAM-T20:1992 method of:

47.4 dB for a frequency of 900 MHz,
    50.4 dB for a frequency of 1800 MHz, and
    54.8 dB for a frequency of 2100 MHz.

According to another embodiment of the textile surface, the textile surface differs from the previous embodiment in that the warp threads 15 are strands made by twisting a steel thread with a polyester thread and in that the weft threads 14 are formed by a core, made from a polymer of the polyamide type, and covered with silver.

According to this embodiment, with a composition of 32% silver-covered polyamide threads, 33% stainless steel threads and 35% polyester threads, a textile material 11 including two juxtaposed textile surfaces has electromagnetic wave attenuations measured using the GAM-T20:1992 method of:

47.8 dB for a frequency of 900 MHz,
    51.4 dB for a frequency of 1800 MHz, and
    55.4 dB for a frequency of 2100 MHz.

According to another embodiment of the textile surface, the textile surface differs from the previous embodiments in that the warp threads 15 are formed by a core, made from a polymer of the polyamide type, and covered with silver, and in that the weft threads 14 are formed by 60% strands made by twisting a steel thread with a polyester thread and 40% threads formed by a core, made from a polymer of the polyamide type, and covered with silver.

According to this embodiment with a composition of 75% silver-covered polyamide threads, 14% stainless steel threads and 14% polyester threads, a textile material 12 including two juxtaposed textile surfaces has electromagnetic wave attenuations measured using the GAM-T20:1992 method of:

48 dB for a frequency of 900 MHz,
    51 dB for a frequency of 1800 MHz, and
    55 dB for a frequency of 2100 MHz.

The textile surface may also be a textile surface formed using a production method other than weaving, such as knitting or forming a nonwoven surface.

During the use of the protective device 1, the mobile telephone 2 is positioned in the maintaining means. Thus, the user can access the controls of the mobile telephone 2 by positioning the flap 5 retracted from the mobile telephone 2 and is also protected from electromagnetic waves emitted by the mobile telephone 2 when the flap 5 bears on the front face 10 of the mobile telephone 5.

Figure 4:
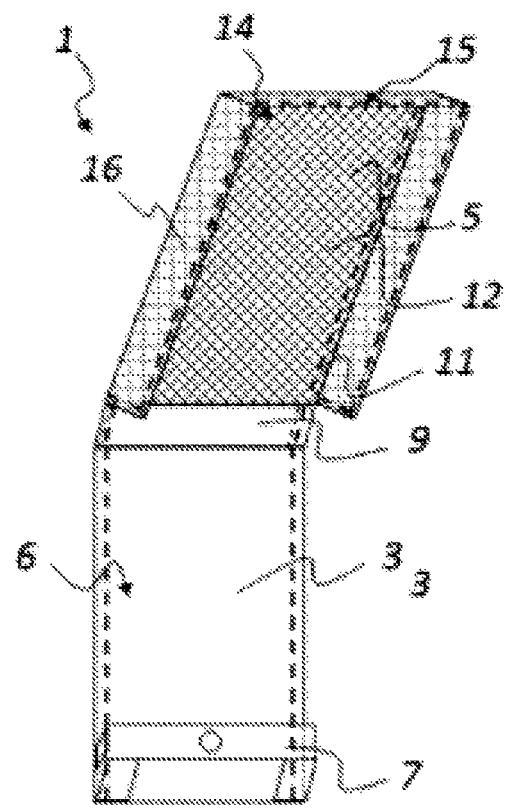
FIG. 4 is a perspective view of a second embodiment of the protective device against electromagnetic waves with no mobile telephone, the trim of the part comprising the textile surface having been removed.
Figure 5:
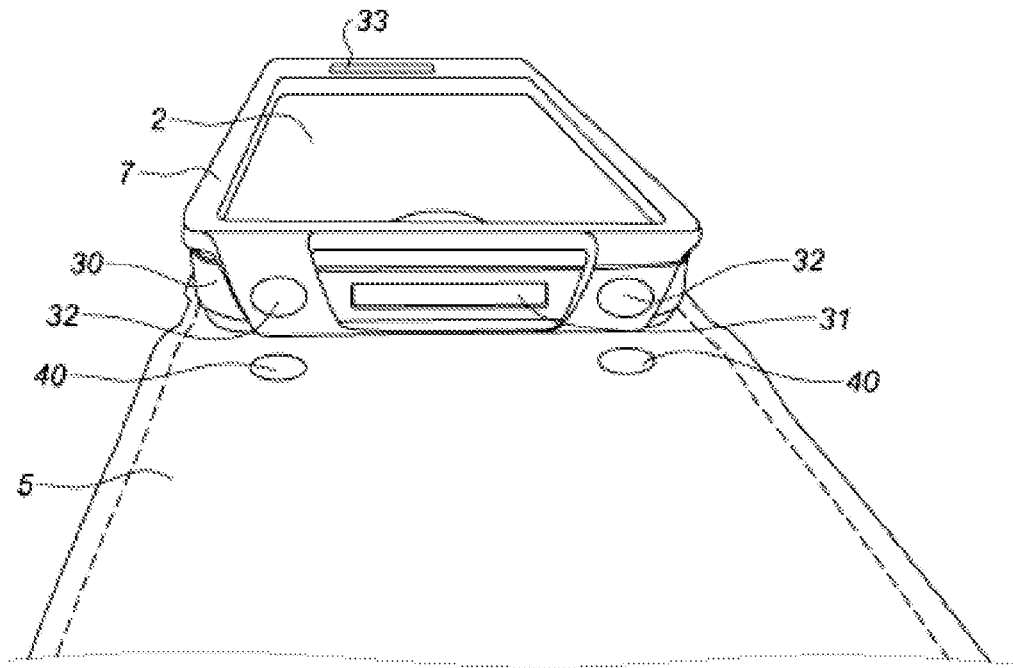
FIG. 5 is a perspective view of a third embodiment of the protective device against electromagnetic waves.
Figure 6:
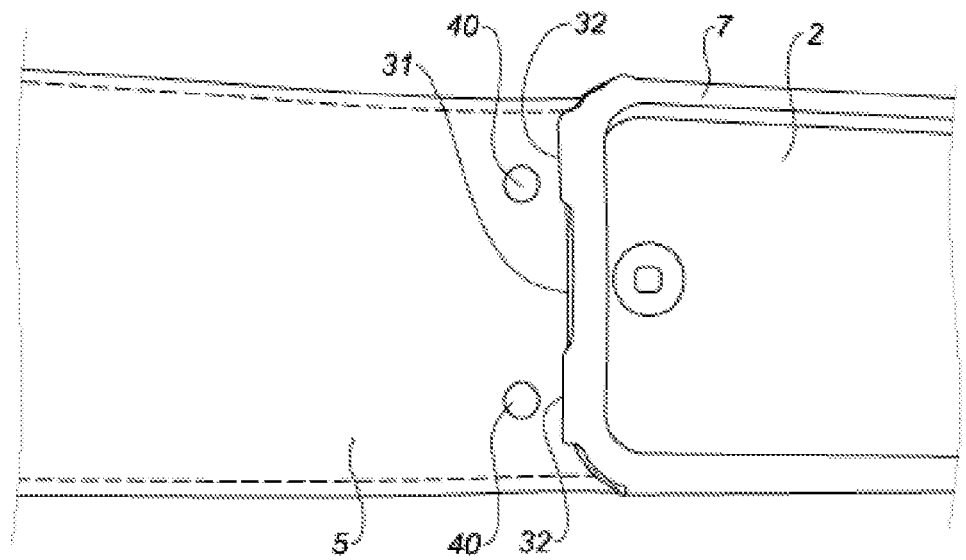
FIG. 6 is a first top view of the protective device of FIG. 5.
Figure 7:
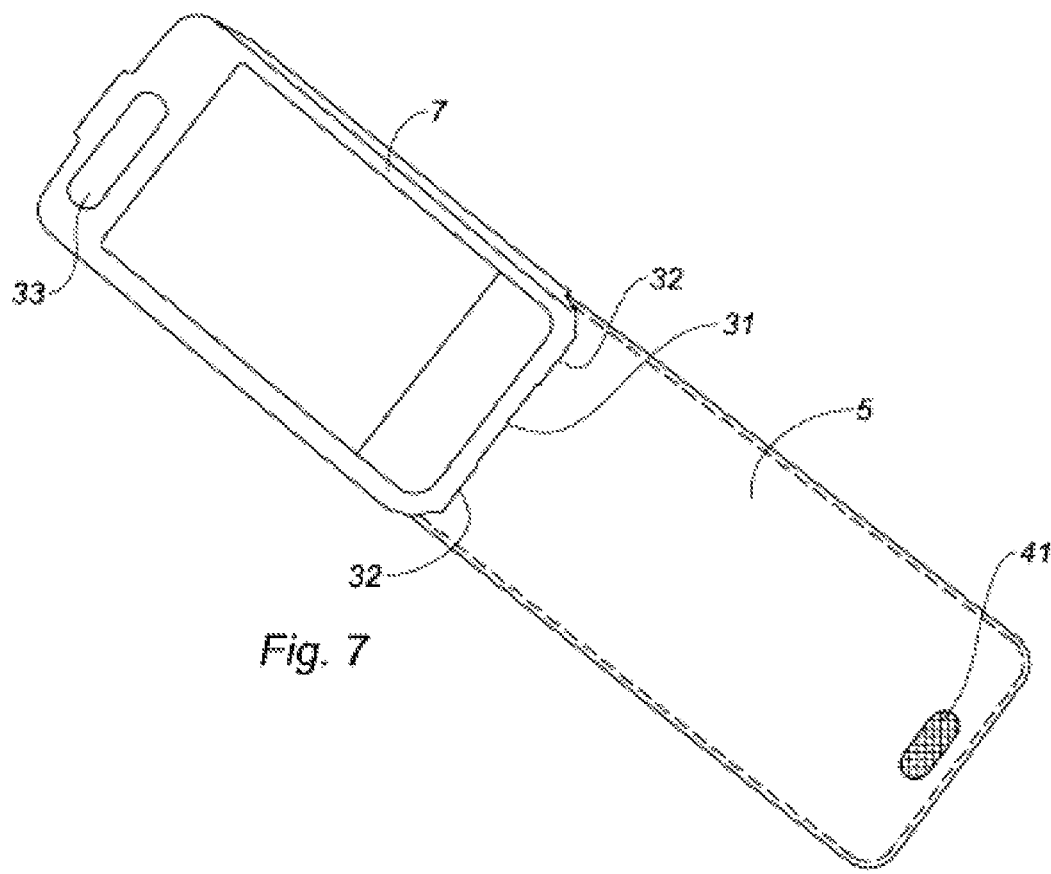
FIG. 7 a second top view of the protective device of FIG. 5.
Figure 8:
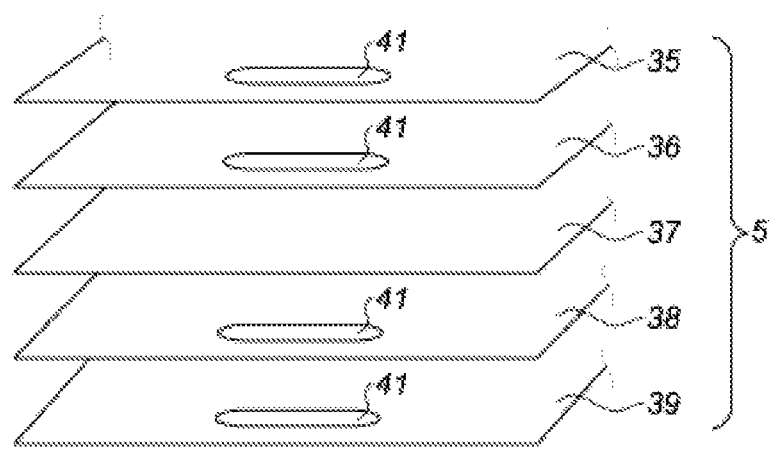
FIG. 8 is a perspective view of the flap of the protective device of FIG. 5.

FIG. 4 illustrates a second embodiment of the protective device 1. Such a protective device 1 differs from a protective device 1 according to the first embodiment in that it has lateral walls 16 on the edges of the flap 5, said lateral walls having a textile layer to perfect the protection against electromagnetic waves during a telephone call.

This protective device 1 makes it possible both to ensure optimal protection for the user, the front face 10 of the mobile telephone 2 being encapsulated by the flap 5 and the lateral walls 16, and allowing, via the support surface 6, wireless communication with the closest GSM terminal.

The textile surfaces, and the textile materials 12 including such textile surfaces, can also be used for applications other than the protective devices 1 described above. They may be used for other protective systems against electromagnetic waves, such as clothing for pregnant women, individuals who are sensitive to electromagnetic waves, or individuals with a pacemaker.

The textile surfaces, and the textile materials including such textile surfaces, can also be used for applications requiring insulation against electromagnetic waves, such as shielding electronic devices, whether medical or others, or insulating a location relative to wireless communication networks.

FIGS. 5 to 8 illustrate a third embodiment of the protective device 1.

This third embodiment is identical to the first embodiment, with the exception that the cradle 7 extends over the entire perimeter of the support surface 6.

The cradle 7 is configured to allow access to a power port 31 (illustrated in FIG. 5) to recharge the battery of the mobile telephone 2.

The cradle 7 has orifices 32 arranged to be positioned centered across from the microphones of the mobile telephone 2, when the latter is received in the cradle 7.

The cradle 7 has an orifice 33 arranged to be positioned centered across from the speaker of the mobile telephone 2, when the latter is received in the cradle 7.

The flap 5 is made by successively stacking (illustrated in FIG. 8):

- a layer 35 forming an outer facing, for example made from leather or plastic;
- a reinforcing layer 36, for example made from Plexiglas;
- a layer 37 forming a protective area, made from a textile surface, or a textile material 12 including at least two textile surfaces as presented above;
- a layer 38, for example made from cardboard; and
- a layer 39 forming an inner facing, for example made from suede cloth.

The layers 35, 36, 38 and 39 each comprise two orifices 40 arranged such that when the flap 5 is in the closed position, the orifices 40 are positioned centered across from the microphones of the mobile telephone.

The orifices 40 make it possible to limit the attenuation of the acoustic waves picked up by the microphone of the mobile telephone, when the flap 5 is in the closed position.

Furthermore, the layers 35, 36, 38 and 39 each comprise an orifice 41 arranged such that when the flap 5 is in the closed position, each orifice 41 is positioned centered across from the speaker of the mobile telephone.

The orifices 41 make it possible to limit the attenuation of the acoustic waves generated by the speaker of the mobile telephone, when the flap 5 is in the closed position.

The layer 37 has no orifices 40 and 41, so as to prohibit the passage of the electromagnetic waves through the cover and protect the user during usage conditions.

The invention is of course not limited solely to the embodiments of these textile surfaces and textile materials to absorb the electromagnetic waves and protective devices described above as examples; on the contrary, it encompasses all alternative embodiments. The metals used may in particular be metals other than silver and steel.

The invention claimed is:

1. A textile surface for at least partially absorbing electromagnetic waves, comprising textile elements of at least first and second types, the textile elements of the first and second types having electrical conduction properties, each textile element of the first type including a synthetic-material core covered with a first metal, the textile elements of the second type being made from a second metal, and further comprising textile elements of a third type made from electrically insulating material, wherein the textile surface includes covered strands or threads respectively obtained by twisting or covering at least one textile element of the third type with at least one textile element of the first type or the second type.

2. The textile surface according to claim 1, wherein the first metal is silver.

3. The textile surface according to claim 1, wherein the core of the textile elements of the first type is made from a polymer of the polyamide type.

4. The textile surface according to claim 1, wherein the second metal is steel or a steel alloy.

5. The textile surface according to claim 1, wherein it is obtained by weaving.

6. The textile surface according to claim 5, wherein it has weft threads including textile elements of the first or second type, the textile surface having warp threads including textile elements of a different type, from among the textile elements of the first and second types.

7. The textile surface according to claim 6, wherein the textile surface is formed from polyamide threads covered with silver for the weft or warp threads and stainless steel/polyester threads for the warp or weft threads, respectively.

8. A textile material for at least partially absorbing electromagnetic waves comprising at least two layers each made up of a textile surface including textile elements of at least first and second types, the textile elements of the first and second types having electrical conduction properties, each textile element of the first type including a synthetic-material core covered with a first metal, the textile elements of the second type being made from a second metal, and further comprising textile elements of a third type made from electrically insulating material, wherein the textile surface includes covered strands or threads respectively obtained by twisting or covering at least one textile element of the third type with at least one textile element of the first type or the second type.

9. A protective device against electromagnetic waves designed to house a mobile telephone, the device including:
a housing designed to receive the mobile telephone, and
at least one protective area designed to be inserted between the head of a user and the mobile telephone,
wherein the protective area includes a textile surface or a textile material for at least partially absorbing electromagnetic waves including at least two layers each made up of a textile surface, the textile surface including textile elements of at least first and second types, the textile elements of the first and second types having electrical conduction properties, each textile element of the first type including a synthetic-material core covered with a first metal, the textile elements of the second type being made from a second metal, and further comprising textile elements of a third type made from electrically insulating material, wherein the textile surface includes covered strands or threads respectively obtained by twisting or covering at least one textile element of the third type with at least one textile element of the first type or the second type.

10. The protective device according to claim 9, wherein the device includes a flap which, including the protective area, can be moved between an open position, in which the flap is designed to be positioned retracted from the mobile telephone received in the housing, and a closed position, in which the flap is designed to be positioned near the mobile telephone.

11. The protective device according to claim 10, wherein the flap is made by stacking at least:
a first layer forming said protective area, made in the textile surface or the textile material; and
a second layer forming an outer facing, the second layer comprising at least one first orifice arranged such that when the flap is in the closed position, each first orifice is positioned centered across from a microphone of the mobile telephone.

12. The protective device according to claim 11, wherein the second layer forming the outer facing comprises at least one second orifice arranged such that when the flap is in the closed position, each second orifice is positioned centered across from a speaker of the mobile telephone.

13. The protective device according to claim 11, wherein the second layer is made from leather or plastic.

14. The protective device according to claim 11, wherein the stack also comprises a third layer forming an inner facing, this third layer comprising at least one first orifice, and at least one second orifice, arranged such that when the flap is in the closed position, each first orifice is positioned centered across from a microphone of the mobile telephone, and each second orifice is positioned centered across from a speaker of the mobile telephone.

15. The protective device according to claim 14, wherein the third layer is made from suede cloth.

16. The protective device according to claim 14, wherein the stack also comprises a fourth, reinforcing layer, positioned between the second and third layers, this fourth layer comprising at least one first orifice, and at least one second orifice, arranged such that when the flap is in the closed position, each first orifice is positioned centered across from a microphone of the mobile telephone, and each second orifice is positioned centered across from the speaker of the mobile telephone.

17. The protective device according to claim 16, wherein the fourth layer is made from Plexiglas.

18. The protective device according to claim 16, wherein the stack comprises a fifth layer made from cardboard, this fifth layer comprising at least one first orifice, and at least one second orifice, arranged such that when the flap is in the closed position, each first orifice is positioned centered across from a microphone of the mobile telephone, and each second orifice is positioned centered across from a speaker of the mobile telephone.

19. The protective device according to claim 11, wherein the housing is provided with at least one first orifice arranged to be positioned centered across from a microphone of the mobile telephone, and at least one second orifice arranged to be positioned centered across from a speaker of the mobile telephone, when said mobile telephone is received in the housing.

\* \* \* \* \*